United States Patent [19]

Ben-Efraim

[11] Patent Number: 5,761,249
[45] Date of Patent: *Jun. 2, 1998

[54] SYNCHRONIZATION ARRANGEMENT FOR DECODER/DE-INTERLEAVER

[75] Inventor: Nadav Ben-Efraim, Sunnyvale, Calif.

[73] Assignee: LSI Logic Corporation, Milpitas, Calif.

[*] Notice: The term of this patent shall not extend beyond the expiration date of Pat. No. 5,519,734.

[21] Appl. No.: 619,300

[22] Filed: Mar. 21, 1996

Related U.S. Application Data

[63] Continuation of Ser. No. 290,321, Aug. 15, 1994, Pat. No. 5,519,734.
[51] Int. Cl.$^6$ .................. H04L 27/06; H04L 7/00
[52] U.S. Cl. .................. 375/341; 375/354
[58] Field of Search .................. 375/341, 354, 375/362, 262, 340, 368, 365; 371/37.5, 37.4, 39.1, 38.1, 42, 43, 45, 46, 44; 370/100.1, 105.4, 105.5, 520

[56] References Cited

U.S. PATENT DOCUMENTS

| | | | |
|---|---|---|---|
| 3,988,677 | 10/1976 | Fletcher et al. | 371/37.5 |
| 4,633,486 | 12/1986 | Berlekamp et al. | 375/368 |
| 4,907,233 | 3/1990 | Deutsch et al. | 371/37.4 |
| 4,945,549 | 7/1990 | Simon et al. | 371/43 |
| 5,023,889 | 6/1991 | Divsalar et al. | 371/43 |
| 5,241,563 | 8/1993 | Paik et al. | 375/309 |
| 5,363,408 | 11/1994 | Paik et al. | 375/341 |
| 5,396,504 | 3/1995 | Pack | 371/37.4 |
| 5,400,347 | 3/1995 | Lee | 371/37.5 |

*Primary Examiner*—Tesfaldet Bocure
*Attorney, Agent, or Firm*—Oppenheimer Wolff & Donnelly LLP

[57] ABSTRACT

A decoder de-interleaver comprises a de-interleaver for de-interleaving received interleaved encoded data that includes periodic decoder synchronization signals to produce de-interleaved encoded data. A decoder decodes the de-interleaved encoded data to produce output data. The de-interleaver has a latency such that the de-interleaved encoded data is delayed by (B−1) times a period of the decoder synchronization signals plus a constant interval, where B is the interleave depth. A synchronization pulse generator receives the interleaved and encoded data and generates decoder synchronization pulses that are substantially coincident with the decoder synchronization signals. A delay unit is connected between the synchronization pulse generator and the decoder for delaying the decoder synchronization pulses by the constant interval. The decoder thereby receives decoder synchronization pulses that correspond to previous decoder synchronization signals, but functions properly because the relative timing is correct. The decoder has an error detecting function by which the first B−1 decoder synchronization pulses that are generated before the de-interleaver produces valid de-interleaved encoded data are ignored.

29 Claims, 4 Drawing Sheets

SYNCHRONIZATION ARRANGEMENT FOR DECODER/DE-INTERLEAVER

CROSS-REFERENCE TO RELATED APPLICATION

This application is a continuation of application Ser. No. 08/290,321 filed Aug. 15, 1994, now issued as U.S. Pat. No. 5,519,734 on May 21, 1996.

BACKGROUND OF THE INVENTION

1. Field of the Invention

The present invention generally relates to the art of electronic data transmission, and more specifically to an arrangement for synchronizing a decoder/de-interleaver.

2. Description of the Related Art

Improvements in digital communications technology have increased the demands on Forward Error Correction (FEC) techniques. For example, compressed video systems require an extremely low Bit-Error Rate (BER) on the order of 1e-12 (one error per $10^{12}$ bits of data). Conventional FEC techniques require high transmitter power and large data overhead to achieve these low BERs.

The "rate" R of the code is defined as the reciprocal of the bandwidth expansion. For example, an R=½ code doubles the bandwidth or data rate in the transmission channel. If two individual codes are concatenated (an outer code and an inner code), the overall rate is the product of the two codes.

Another measure of the effectiveness of an error correction technique is the Signal to Noise Ratio (SNR) that is required to obtain the necessary BER at the output of the outer decoder. A low SNR corresponds to a low power requirement for the transmitter, and thereby lower cost. The best codes have a high rate R and a low SNR for a given BER.

The inner codes that are selected usually perform well at low SNR (high channel BER). They can easily push the BER from the range of 1e-2 to the range of 1e-4. However, it is difficult for the inner code alone to reach the 1e-12 BER system requirement.

The outer codes, on the other hand, can easily push the BER from 1e-4 to 1e-12, but usually will not work at low SNR. Hence, the concatenated scheme is highly desirable for systems such as Direct Broadcast Satellite (DBS), and create only a moderate bandwidth expansion.

The above analysis applies only to the assumption that the errors are uncorrelated or randomly distributed. In practical applications, the output of the inner decoder tends to be very bursty. This causes the error pattern to be highly correlated and concentrated only in a small portion of the bit stream. Under these conditions, the outer decoder will not perform effectively.

In order to alleviate this problem, an interleaving/de-interleaving function is added to the system. Interleaving is used in combination with encoding for error correction. An advantageous arrangement, which is applicable to numerous types of burst-error communications channels, generally comprises an interleaver connected between the outer encoder and the inner encoder at the transmitter, and a de-interleaver connected the inner decoder and an outer decoder at the receiver. The interleaver redistributes the data bits or symbols being transmitted over the channel so that the symbols are mutually separated by substantially more than the length of a "typical" burst of errors.

Interleaving effectively makes the channel appear like a random-error channel to a decoder at the receiving end. For some high frequency channels, this technique can improve the performance by one to three orders of magnitude. The concatenation and interleaving of several FEC techniques reduces the power and bandwidth expansion required by a single error correction code to obtain the same low error rate.

A problem has remained in the prior art regarding the synchronization of the de-interleaver and the outer decoder. Although the decoder synchronization pulses are generated in response to synchronization signals in the input data stream, the de-interleaver requires B synchronization pulses for each synchronization pulse applied to the outer decoder, where B is the interleave depth.

In addition, the de-interleaver has a latency of $[(B-1) \times N]+C$ system clock pulses, where N is the interleave block length and C is number of clock pulses corresponding to a small constant time interval that depends on the design of the de-interleaver.

The latency of the de-interleaver would, if no compensation were made, cause the data to reach the outer decoder $[(B-1) \times N]+C$ clock pulse periods after the corresponding data, thereby preventing synchronization from occurring.

A prior art solution is to delay the synchronization pulses by $[(B-1) \times N]+C$ decoder synchronization pulse periods such that the decoder synchronization pulses and data reach the outer decoder in synchronism. Typically, a programmable counter is employed to produce the required delay.

For example, the widely used Zenith VSB system uses the parameters B=26 and N=208. Assuming an 8-bit byte length, the count required to produce the desired delay is $[(B-1) \times N \times 8]+C=41,000+C$ clock pulses.

This counter arrangement is disproportionately large and expensive for many applications. In addition, the counter must be programmed for each combination of B and N, requiring additional configuration circuitry.

SUMMARY OF THE INVENTION

It is an object of the present invention to overcome the heretofore unsolved problem of synchronizing a decoder/de-interleaver without using a large programmable delay counter and configuration circuitry as is required in the prior art.

In accordance with the present invention, a decoder/de-interleaver comprises a de-interleaver for de-interleaving received interleaved encoded data that includes periodic decoder synchronization signals to produce de-interleaved encoded data. A decoder decodes the de-interleaved encoded data to produce output data.

The de-interleaver has a latency such that the deinterleaved encoded data is delayed by (B-1) times a period of the decoder synchronization signals plus a constant interval, where B is the interleave depth. A synchronization pulse generator receives the interleaved and encoded data and generates decoder synchronization pulses that are substantially coincident with the decoder synchronization signals.

A delay unit is connected between the synchronization pulse generator and the decoder for delaying the decoder synchronization pulses by the constant interval. The decoder thereby receives decoder synchronization pulses that correspond to previous decoder synchronization signals, but functions properly because the relative timing is correct.

The decoder has an error detecting function by which the first B-1 decoder synchronization pulses that are generated before the de-interleaver produces valid de-interleaved encoded data are ignored.

DETAILED DESCRIPTION OF THE INVENTION

Figure 1:
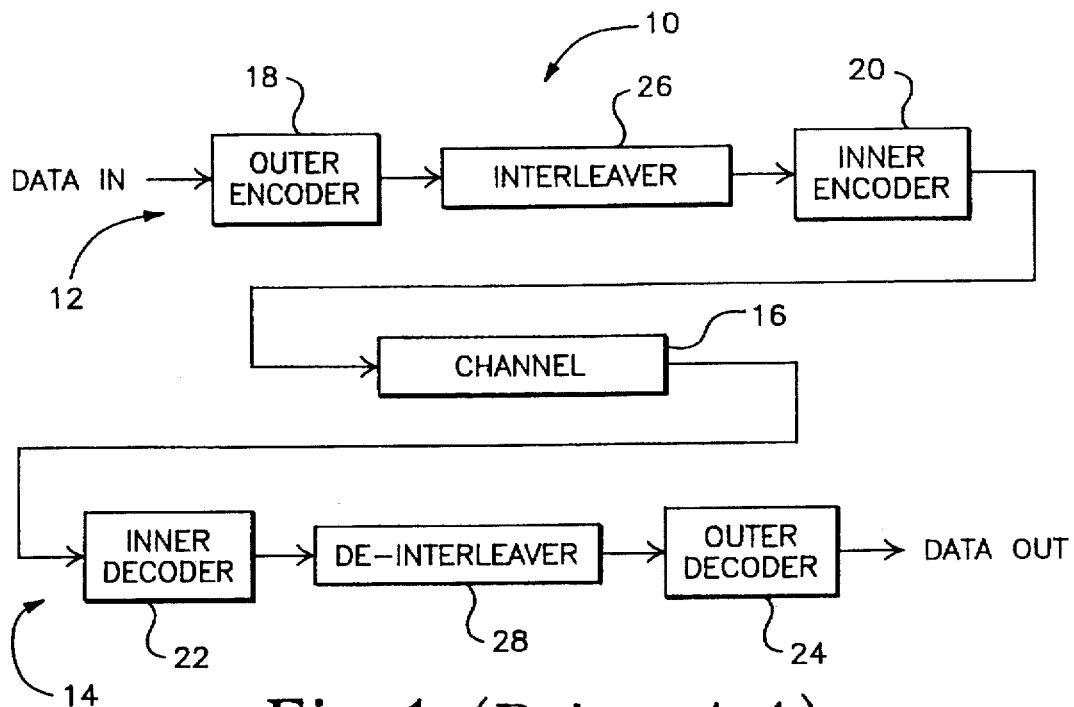
FIG. 1 is a block diagram illustrating a data channel that conventionally includes a encoding and interleaving arrangement.

FIG. 1 illustrates a basic interleaved/concatenated FEC communications system 10, comprising a transmitter 12 and a receiver 14 that are connected by a communications channel 16. The transmitter 12 includes a first or outer encoder 18 that encodes input data using a Reed-Solomon code or other suitable code, and a second or inner encoder 20 that further encodes the data using a Convolutional or Hamming code. The receiver 14 includes an inner decoder 22 and an outer decoder 24 that are conjugate to the encoders 2Q and 18 respectively.

Figure 2:
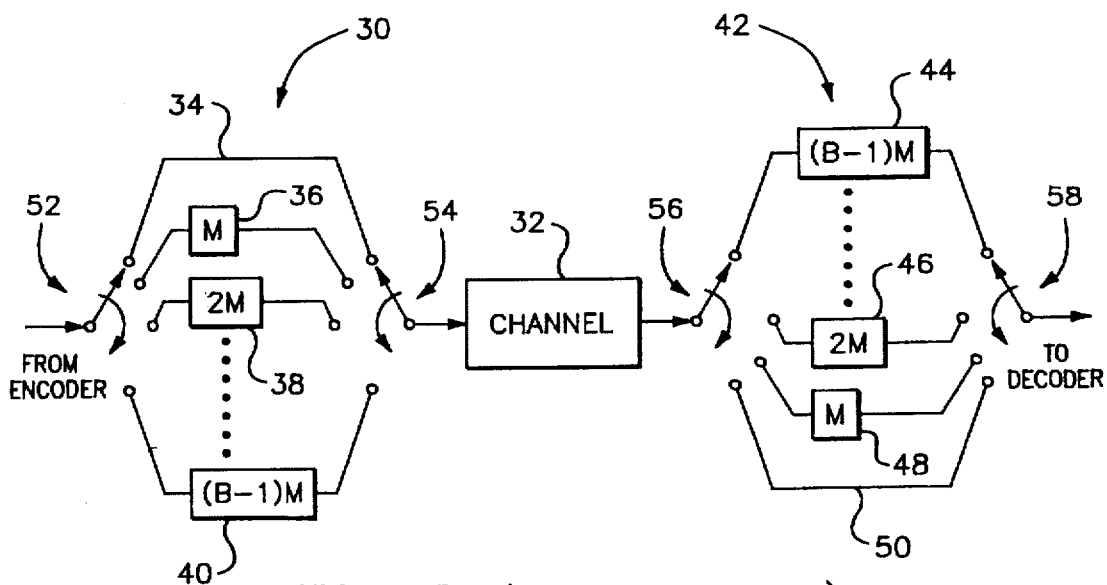
FIG. 2 is a diagram illustrating the basic configuration of a conventional convolutional interleaver and de-interleaver.

As also illustrated in FIG. 2, the system 10 further comprises an interleaver 26 connected between the encoders 18 and 20 and a de-interleaver 28 connected between the decoders 22 and 24. The interleaver 26 reorders a sequence of symbols or data bits in a one-to-one deterministic manner. The de-interleaver 28 restores the reordered sequence to its original ordering.

More specifically, the de-interleaver 28 breaks the bursts of errors from the inner decoder 22 into pieces and spreads the errors into several different outer code words. This eases the burden on the outer decoder 24, which is able to clean up the remaining errors successfully.

The reduction of required power by one-half for the concatenated code can result in a significantly lowered cost in an application such as Direct Broadcast Satellite (DBS) video systems. The reduction in required power can be manifested in cheaper transmitters and receivers.

A periodic interleaver is an interleaver for which the interleaving permutation is a periodic function of time. Two basic types of periodic interleavers are known in the prior art; block interleavers and convolutional interleavers.

A block interleaver writes symbols into an array by columns, and reads them out by rows. The de-interleaver writes the received symbols by rows, and reads them out by columns, thus, reversing the interleaving operation. The interleaving/de-interleaving permutation is performed on block boundaries.

Assuming a block length (number of columns) of N and an interleave depth (number of rows) of B, the number of memory locations required to implement a block interleaver is 2×N×B, since all of the symbols must be written into memory before they can be read out.

A convolutional Interleaver performs a periodic permutation over a continuous semi-infinite sequence of symbols. This group of interleavers results in an easier synchronization scheme and requires a smaller RAM configuration while achieving the same performance.

A convolutional helical interleaver achieves the same performance as the block interleaver, but requires only half as much memory for implementation. In the interleaver operation, reading is done by rows and writing is done by columns. However, the write location is forced to equal the read location after each N symbols. This configuration enables the memory requirement to be reduced to N×B.

Optimal implementations for convolutional periodic interleavers are proposed in an article entitled "Realization of Optimum Interleavers", by John Ramsey, in IEEE Transactions on Information Theory, May 1970, pp. 338–345, and also in an article entitled "Burst-Correcting Codes for the Classic Bursty Channel", by G. David Forney, in IEEE Transactions on Communications Technology, Vol. COM-19, No. 5, October 1971, pp. 772–780.

These solutions, although different, are optimal and reach the minimum bound of required memory and total end to end delay. They both reduce the required memory to about (N×B)/2 at the transmitter and at the receiver, which is half the memory required for a helical interleaver, and about 25% of the memory required for a block interleaver.

Forney's optimal convolutional interleaver configuration is illustrated in FIG. 2. An interleaver 30 at a transmitting end of a communications channel 32 comprises a plurality of shift register segments 34, 36, 38 and 40 having different lengths. A de-interleaver 42 at a receiving end of the channel 32 comprises a plurality of shift register segments 44, 46, 48 and 50 having the same lengths as the segments 40, 38, 36 and 34 of the interleaver 30 respectively.

The length $C_K$ (the number of stages in the shift registers) of each segment 34, 36, 38 and 40 is selected in accordance with a parameter M=N/B and a segment number K such that $C_K = K \times M = K \times (N/B)$. There are B segments, for which K is $K_0$ to $K_{(B-1)}$ respectively.

For the first segment 34, K=0, and the length C=0 (the first segment 34 is a direct connection). For the second segment 36, K=1, and C=M. For the last segment 40, K=B−1, and C=(B−1)×M.

The interleaver 30 further comprises an input switch 52 and an output switch 54, whereas the de-interleaver 42 comprises an input switch 56 and an output switch 58. The interleaver 30 is operated by using the switches 52 and 54 to sequentially select the segments 34, 36, 38 and 40.

To select the segment 34, for example, the switches 52 and 54 are moved to the illustrated positions such that the input of the segment 34 is connected to the input of an encoder such as illustrated at 18 in FIG. 1, and the switch 54 is connected between the output of the segment 34 and the channel 32.

After a segment 34, 36, 38 or 40 is selected, the oldest symbol or data bit in the segment is read out from the right end of the respective shift register, a new symbol is written into the left end of the shift register, and all other symbols are shifted to the right. The switches 52 and 54 are then operated to select the next segment. On the de-interleaver side the reverse operation is performed using the switches 56 and 58, and the original order is restored.

Figure 3:
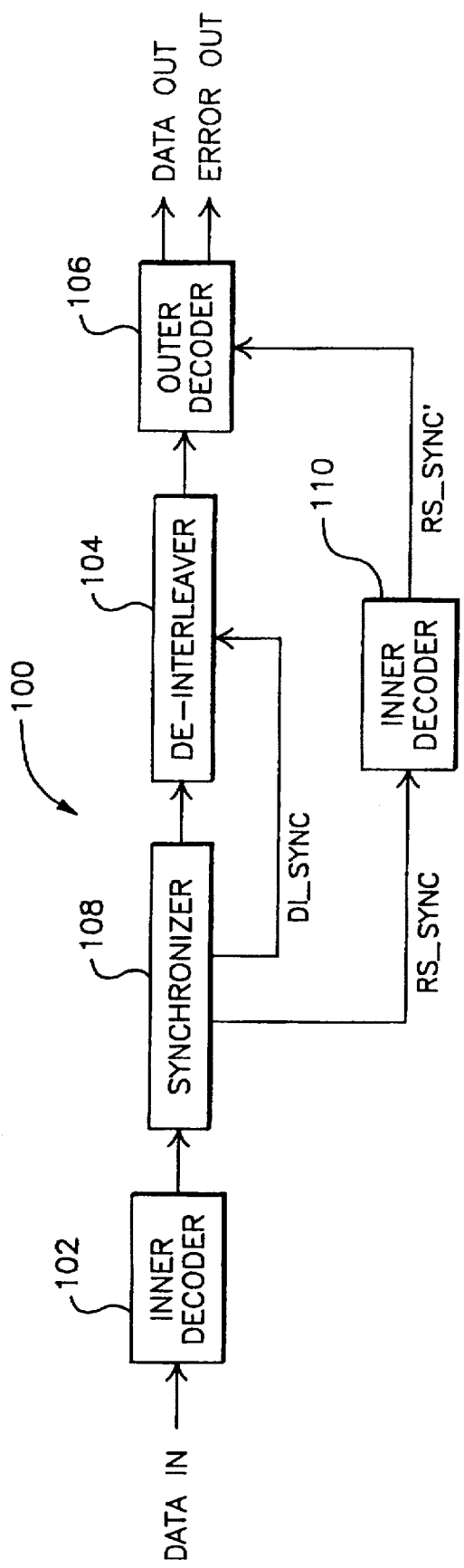
FIG. 3 is a block diagram illustrating a decoder/de-interleaver synchronization system according to the present invention.

A concatenated decoder/de-interleaver system 100 embodying the present invention is illustrated in FIG. 3. The system 100 comprises an inner decoder 102, a de-interleaver 104 and an outer decoder 106 that correspond to the inner decoder 22, de-interleaver 28 and outer decoder 24 as described above with reference to FIGS. 1 and 2.

The de-interleaver 104 is preferably a convolutional de-interleaver, whereas the outer decoder is preferably a Reed-Solomon decoder, although the invention is not so limited. The operation of elements per se is essentially similar to that as described above. The de-interleaver 104 receives and de-interleaves interleaved encoded data to produce de-interleaved encoded data that is applied to the outer decoder 106. The outer decoder 106 decodes the de-interleaved encoded data to produce output data.

A synchronizer 108 that is connected between the inner decoder 102 and the de-interleaver 104 generates and applies de-interleaver synchronization pulses DI_SYNC to the de-interleaver 104. The synchronizer 108 further generates decoder synchronization pulses RS_SYNC which are delayed by a delay unit 110 to produce delayed decoder synchronization pulses RS_SYNC' that are applied to the outer decoder 106. The de-interleaver 104 and the outer decoder 106 are synchronized by the pulses DI_SYNC and RS_SYNC for operating on data applied thereto respectively.

Figure 4:
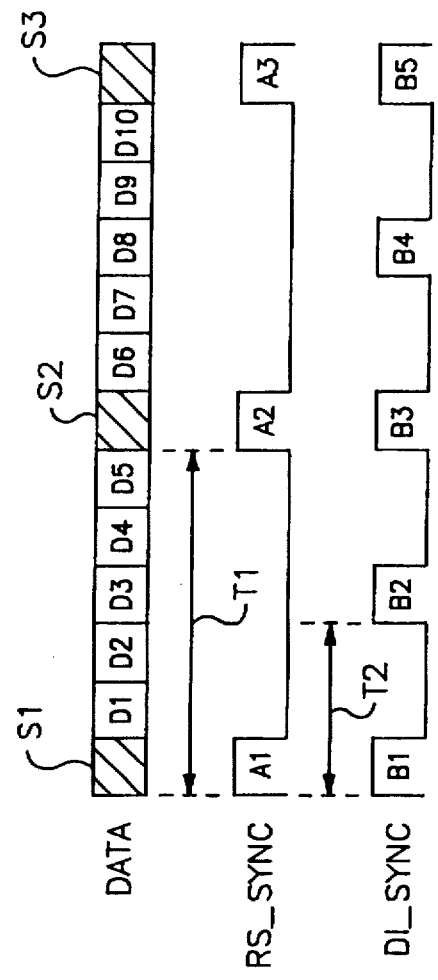
FIG. 4 is a timing diagram illustrating the relationship between data, decoder synchronization pulses and de-interleaver synchronization pulses in the arrangement of FIG. 3.

As illustrated in FIG. 4, input data DATA includes periodic synchronization signals that are indicated by hatching and designated as S1, S2 and S3. At least one data element or block of data is inserted between each synchronization signal. As illustrated, five data elements are inserted between each synchronization signal. More specifically, data elements D1 through D5 are inserted between the synchronization signals S1 and S2, and data elements D6 through D10 are inserted between the synchronization signals S2 and S3 respectively.

The type and number of data elements that are inserted between consecutive synchronization signals is not the particular subject matter of the invention. For example, one or more frames of video data, blocks of audio data, blocks of binary computer data, etc., can be inserted between each synchronization signal.

The synchronizer 108 generates an RS_SYNC pulse in response to each synchronization signal. As viewed in FIG. 4, the synchronizer 108 generates RS_SYNC pulses A1, A2 and A3 in response to, and substantially coincident in time with, the synchronization signals S1, S2 and S3 respectively. The period between consecutive synchronization signals, and equivalently between RS_SYNC pulses, is designated as T1.

In the simplified example of FIG. 4, it will be assumed that the interleave depth of the de-interleaver 104 is B=2. Thus, the synchronizer 108 generates B=2 DI_SYNC pulses, designated as B1 through B5, for each RS_SYNC pulse A1 through A3. More specifically, two DI_SYNC pulses B1 and B2 corresponding to the first RS_SYNC pulse A1 are generated during the first period T1, etc. The DI_SYNC period, designated as T2, is therefore a fraction $1/B=\frac{1}{2}$ of the RS_SYNC period T1.

Although not illustrated in detail, the synchronizer 108 comprises circuitry for generating a first DI_SYNC pulse at the same time it generates a RS_SYNC pulse. In addition, the synchronization 108 generates and inserts a second DI_SYNC pulse in each period T1 equally spaced between the two adjacent RS_SYNC pulses.

Figure 5:
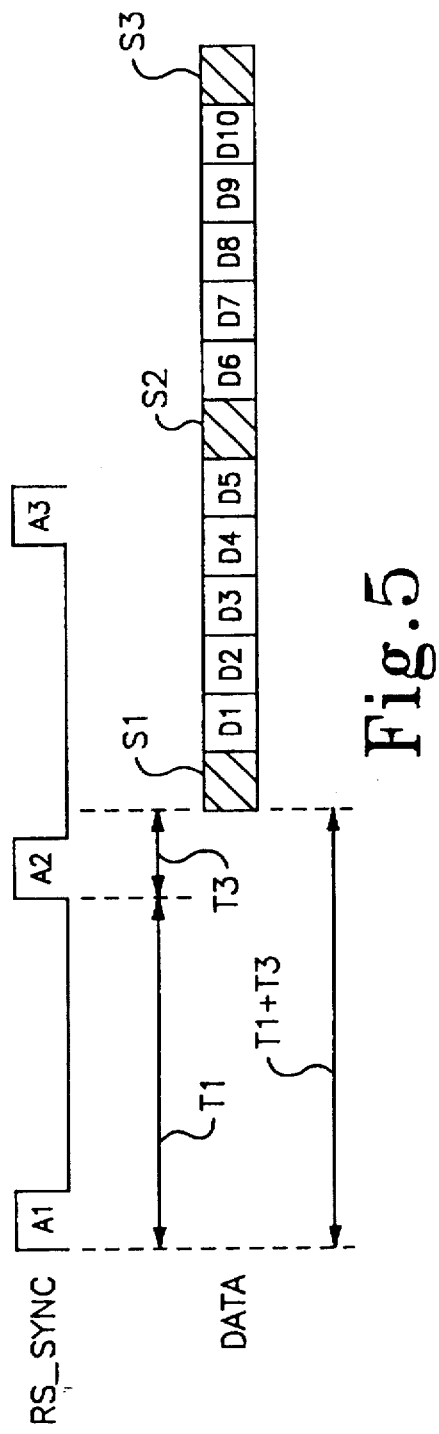
FIG. 5 is a timing diagram illustrating the latency of the de-interleaver.

The problem discussed hereinabove regarding the latency of the de-interleaver 104 is illustrated in FIG. 5. The result is that the data is delayed in the de-interleaver 104 by a multiple of the period T1, where the multiple is equal to B−1. The multiple can include the values 0 and 1, where B−1=1 in the example of FIG. 5.

In addition to the delay of B−1 RS_SYNC pulse periods T1, the data is delayed in the de-interleaver 104 by a small constant time interval T3, which corresponds to number of clock pulse cycles C discussed hereinabove. As illustrated in FIG. 5, the total delay is equal to T1+T3.

As discussed above, if no compensation were made, this latency or delay would cause the data to be applied to the outer decoder 106 at a time T1+T3 later than the corresponding RS_SYNC pulses, and would prevent the system 100 from operating in synchronization.

Figure 6:
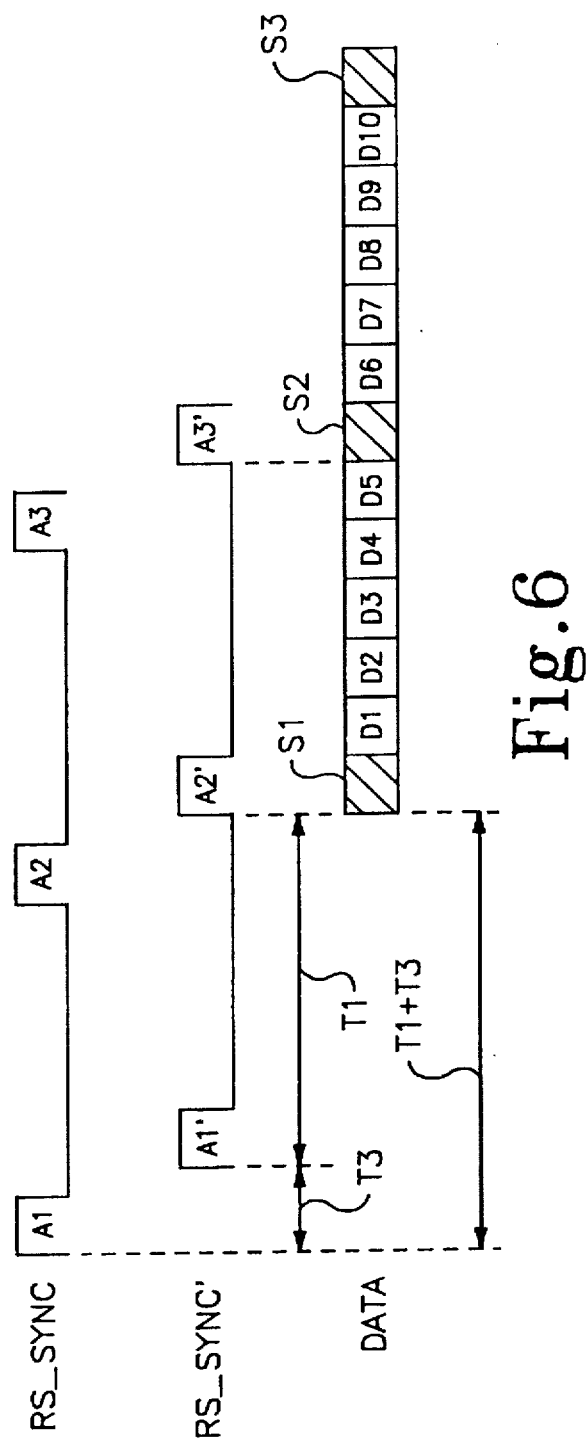
FIG. 6 is a timing diagram illustrating the synchronization arrangement of the present invention.

This problem is overcome in accordance with the present invention as illustrated in FIG. 6. Although the data is delayed in the de-interleaver 104 by the period T1+T3 as described above, the delay unit 110 delays the RS_SYNC pulses to produce the RS_SYNC' pulses by only the small constant time interval T3.

As illustrated in FIG. 6, the first delayed RS_SYNC' pulse A1' occurs before any data is output by the de-interleaver 104. However, the next RS_SYNC' pulse A2' is coincident in time, or synchronized with the first, synchronization signal S1 in the data. Although the RS_SYNC' pulse A2' was generated by the synchronizer 108 in response to the second synchronization signal S2, it is applied to the outer decoder 106 at the correct time to produce synchronization of data.

The decoder 106 is unable to distinguish one RS_SYNC' pulse from another, and thereby synchronizes the block of data D1 to D5 between the synchronization signals S1 and S2 in response to the second RS_SYNC' pulse in the same manner that it would in response to the first RS_SYNC' pulse A1'. As further illustrated, the third RS_SYNC' pulse A3' is applied to the outer decoder 106 in synchronism with the second synchronization signal S2. In this manner, one RS_SYNC' is applied to the outer decoder 106 to synchronize a respective block of data elements, and causes proper operation of the decoder 106.

Figure 7:
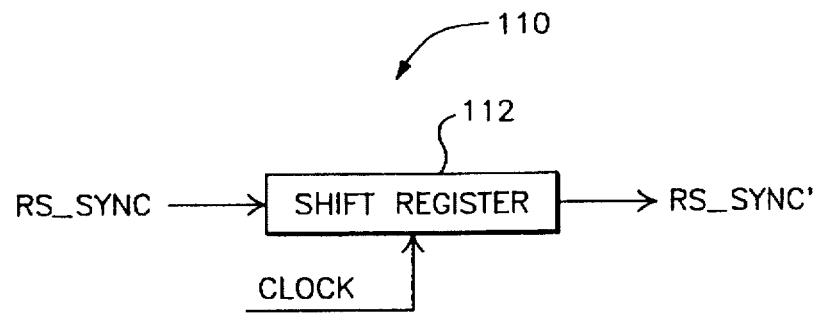
FIG. 7 is a diagram illustrating a delay unit of the present invention.

The delay unit 112 is preferably embodied as a shift register 112 as illustrated in FIG. 7. The RS_SYNC pulses are applied to the input of the shift register 112, shifted through the register 112 in response to system clock pulses CLOCK, and appear at the output thereof as the RS_SYNC' pulses.

The number of elements in the shift register 112 is selected to be equal to the number of clock pulses corresponding to the time interval T3. Thus, in response to clock pulses CLOCK applied to the shift register 112 to cause the RS_SYNC pulses to be shifted therethrough, the RS_SYNC' pulses are delayed relative to the RS_SYNC pulses by the time period T3.

The outer decoder 106 preferably comprises error detection circuitry which generates an ERROR OUT signal when invalid data is being applied thereto. For the reasons described above, B−1 RS_SYNC' pulses will be applied to the outer decoder 106 before the de-interleaver 104 begins to apply valid data thereto.

The error detection circuitry of the outer decoder 106 causes the decoder 106 to produce the ERROR OUT signal until it begins to receive valid data from the de-interleaver 104, therefore effectively ignoring the first B−1 RS_SYNC' pulses that do not correspond to valid data. Thus, the fact that B−1 RS_SYNC' pulses are applied to the outer decoder 106 while the corresponding data is still being processed by the de-interleaver 104 does not cause erroneous operation of the system 100.

Figure 8:
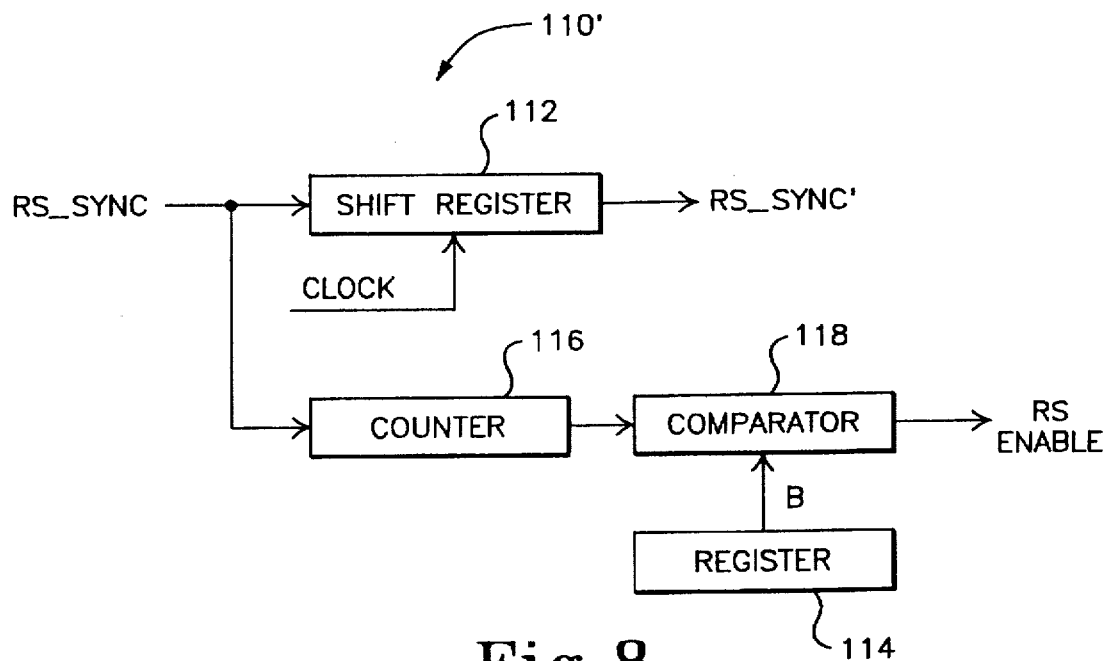
FIG. 8 is a diagram illustrating a modified delay unit of the invention.

FIG. 8 illustrates a modified delay unit 110' which enables the system to function properly using an outer decoder 106 that does not have an appropriate error detection function. In addition to the shift register 112 of the basic delay unit 110, the delay unit 110' further comprises a register 114 or other storage means for storing the numerical value of the interleave depth B.

A counter 116 receives and counts the RS_SYNC pulses that are generated by the synchronizer 108. The outputs of the register 114 and counter 116 are applied to inputs of a comparator 118, which does not produce a signal RS ENABLE as long as the count in the counter 116 is smaller than the number B in the register 114.

The count in the counter 116 will remain smaller than the number B during the time that the first B−1 RS_SYNC' pulses that do not correspond to valid data are being applied to the outer decoder 106. In response to generation of the Bth RS_SYNC pulse, corresponding to the first block of valid data, the count of the counter 116 becomes equal to B and the comparator 118 generates the RS ENABLE signal.

The decoder 106 is disabled as long as the RS ENABLE signal is not applied thereto from the comparator 118. The decoder 106 is enabled for operation in response to the RS ENABLE signal. Thus, erroneous operation of the outer decoder 106 in response to invalid data is prevented, even if the outer decoder 106 is not provided with appropriate error detection circuitry.

Various modifications will become possible for those skilled in the art after receiving the teachings of the present disclosure without departing from the scope thereof. For example, the counter 116 of FIG. 8 can be connected to receive the delayed RS_SYNC' pulses rather than the undelayed RS_SYNC pulses.

I claim:

1. A decoder/de-interleaver, comprising:

a de-interleaver for de-interleaving received interleaved encoded data to produce de-interleaved encoded data;

a decoder for decoding said de-interleaved encoded data to produce output data;

wherein the de-interleaver delays said de-interleaved encoded data by a first predetermined time value;

a synchronization pulse generator for receiving said interleaved and encoded date and generating decoder syncronization pulses; and a delay unit connected between the synchronization pulse generator and the decoder for delaying said decoder synchronization pulses by a second predertermined time value.

2. A decoder/de-interleaver as in claim 1, wherein the synchronization pulse generator further generates and applies to the de-interleaver first periodic de-interleaver synchronization pulses and second periodic de-interleave synchronization pulses equally spaced between said first de-interleaver synchronization pulses by a predetermined period.

3. A decoder/de-interleaver as in claim 2 wherein said predetermined period comprises a predetermined fraction of said period of said decoder synchronization pulses.

4. A decoder/de-interleaver as in claim 3 wherein said predetermined fraction comprises a reciprocal of an interleave depth of said de-interleaver.

5. A decoder/de-interleaver as in claim 1, in which:

the interleaved encoded data is convolutionally interleaved; and the de-interleaver comprises a convolutional de-interleaver.

6. A decoder/de-interleaver as in claim 1, in which:

the interleaved encoded data is Reed-Solomon encoded; and the decoder comprises a Reed-Solomon decoder.

7. A decoder/de-interleaver as in claim 1, in which the delay unit comprises a shift register.

8. A decoder/de-interleaver as in claim 1, wherein the delay comprises an enable signal generator for generating an enable signal when the synchronization pulse generator has generated a predetermined number of said decoder synchronization pulses.

9. A decoder/de-interleaver as in claim 8, in which said predetermined multiple is equal to an interleave depth of the de-interleaver.

10. A decoder/de-interleaver as in claim 9, in which the enable signal generator comprises:

a counter for counting said decoder synchronization pulses;

a register for storing said number; and a comparator for comparing a count of said counter with said number stored in the register and producing said enable signal when said count becomes equal to said number.

11. A decoder/de-interleaver as in claim 1, wherein the delay unit comprises an enable signal generator for generating an enable signal when the synchronization pulse generator has generated a number of said decoder synchronization pulses equal to said predetermined multiple.

12. A method of synchronizing a decoder/de-interleaver, said decoder/de-interleaver comprising a de-interleaver for de-interleaving received interleaved encoded date to produce de-interleaved encoded data, and a decoder for decoding said de-interleaved encoded data to produce output data wherein the de-interleaver delays said de-interleaved encoded data by a first predetermined time value, comprising the steps of:

(a) generating decoder synchronization pulses;

(b) delaying said decoder synchronization pulses by a second predetermined time value to produce delayed decoder synchronization pulses; and (c) applying said delayed decoder synchronization pulses to the decoder.

13. A method as in claim 12, in which said predetermined multiple is equal to an interleave depth of said de-interleaver minus one.

14. A method as in claim 12, further comprising the steps of:

(d) generating periodic first de-interleaver synchronization pulses, and periodic second de-interleaver synchronization pulses equally spaced between said first de-interleaver synchronization pulses by a predetermined fraction of said period of said decoder synchronization pulses; and (e) applying said first and second de-interleaver synchronization pulses to the de-interleaver.

15. A method as in claim 14, wherein said first periodic de-interleaver pulses are substantially coincident with said decoder synchronization pulses.

16. A decoder/de-interleaver as in claim 14, wherein said predetermined period comprises a predetermined fraction of said period of said decoder synchronization pulses.

17. A method as in claim 16, wherein said predetermined fraction is a reciprocal of an interleave depth of said de-interleaver.

18. A method as in claim 12, in which:

the interleaved encoded data is convolutionally interleaved; and the method further comprises the step of:

(d) controlling the de-interleaver to convolutionally de-interleave said encoded interleaved data in synchronism with said first and second de-interleaver synchronization pulses.

19. A method as in claim 12, in which:

the interleaved encoded data is Reed-Solomon encoded; and the method further comprises the step of:

(d) controlling the decoder to decode the de-interleaved encoded data using Reed-Solomon decoding in synchronism with said decoder synchronization pulses.

20. A method as in claim 12, in which step (b) comprises feeding said decoder synchronization pulses through a shift register.

21. A decoder/de-interleaver, comprising:

a de-interleaver for de-interleaving received interleaved encoded data to produce de-interleaved encoded data;

a decoder for decoding said de-interleaved encoded data to produce output data;

wherein the de-interleaver delays said de-interleaved encoded data by a first predetermined time value;

a synchronization pulse generator for receiving said interleaved and encoded data and generating decoder synchronization pulses; and a delay unit connected between the synchronization pulse generator and the decoder for delaying said decoder synchronization pulses by a second predetermined time value, wherein said first predetermined time value is a function of said second predetermined time value.

22. A decoder/interleaver as in claim 21, wherein:

said interleaved encoded data comprises periodic decoder synchronization signals;

said first predetermined time value comprises a predetermined multiple of a period of said decoder synchronization signals plus a constant interval; and said second predetermined time value comprises said constant interval.

23. A decoder/de-interleaver as in claim 21 wherein said predetermined multiple is equal to an interleave depth of said de-interleaver minus one.

24. A decoder/de-interleaver comprising:

a de-interleaver for de-interleaving received interleaved encoded data to produce de-interleaved encoded data;

a decoder for decoding said de-interleaved encoded date to produce output data;

wherein the de-interleaved delays said de-interleaved encoded data by a first predetermined time value;

a synchronization pulse generator for receiving said interleaved and encoded data and generating decoder synchronization pulses; and a delay unit connected between the synchronization pulse generator and the decoder for delaying said decoder synchronization pulses by a second predetermined time value;

wherein the synchronization pulse generator further generates and applies to the de-interleaver first periodic de-interleaver synchronization pulses and second periodic de-interleaver synchronization pulses equally spaced between said first de-interleaver synchronization pulses by a predetermined period; and wherein said first periodic de-interleaver pulses are substantially coincident with said decoder synchronization pulses.

25. A method of synchronizing a decoder/de-interleaver, said decoder/de-interleaver comprising a de-interleaver for de-interleaving received interleaved encoded data to produce de-interleaved encoded data, and a decoder for decoding said de-interleaved encoded data to produce output data wherein the de-interleaver delays said de-interleaved encoded data by a first predetermined time value, comprising the steps of:

(a) generating decode synchronization pulses;

(b) delaying said decoder synchronization pulses by a second predetermined time value to produce delayed decoder synchronization pulses, wherein said first predetermined time value is a function of said second predetermined time value; and (c) applying said delayed decoder synchronization pulses to the decoder.

26. The method of claim 25, wherein:

said interleaved encoded data comprises periodic decoder synchronization signals;

said first predetermined time value comprises a predetermined multiple of a period of said decoder synchronization signals plus a constant interval; and said second predetermined time value comprises said constant interval.

27. A method as in claim 26, wherein step (b) further comprises the step of:

(d) generating an enable signal when a number of said decoder synchronization pulses equal to said predetermined multiple has been generated.

28. A method as in claim 27, in which said predetermined multiple is equal to an interleave depth of the de-interleaver.

29. A method as in claim 28, in which step (d) comprises the substeps of:

(e) storing said number;

(f) counting said decoder synchronization pulses to produce a count;

(g) comparing said count with said stored number; and (h) producing said enable signal when said count becomes equal to said number.

* * * * *